(12) United States Patent
Ko et al.

(10) Patent No.: US 9,368,346 B2
(45) Date of Patent: Jun. 14, 2016

(54) METHOD OF FABRICATING ZINC OXIDE NANOSTRUCTURES USING LIQUID MASKING LAYER

(71) Applicant: GWANGJU INSTITUTE OF SCIENCE AND TECHNOLOGY, Gwangju (KR)

(72) Inventors: Heung-Cho Ko, Gwangju (KR); Hun-Soo Jang, Gwangju (KR); Gun-Young Jung, Gwangju (KR); Bokyeong Son, Gwangju (KR); Hui Song, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 15 days.

(21) Appl. No.: 14/584,446

(22) Filed: Dec. 29, 2014

(65) Prior Publication Data

US 2016/0104616 A1    Apr. 14, 2016

(30) Foreign Application Priority Data

Oct. 14, 2014   (KR) .................. 10-2014-0138442

(51) Int. Cl.
| | |
|---|---|
| *H01L 21/02* | (2006.01) |
| *H01L 51/00* | (2006.01) |
| *B82Y 30/00* | (2011.01) |
| *B82Y 40/00* | (2011.01) |

(52) U.S. Cl.
CPC ............ *H01L 21/02645* (2013.01); *B82Y 30/00* (2013.01); *B82Y 40/00* (2013.01); *H01L 21/02565* (2013.01); *H01L 21/02603* (2013.01); *H01L 51/0026* (2013.01)

(58) Field of Classification Search
CPC ............ H01L 27/1292; H01L 51/0004; H01L 51/0005; H01L 51/56; B82Y 15/00; B82Y 30/00; B82Y 40/00; C01G 19/02; C01G 31/02; C01P 2004/16; C30B 29/16; C30B 29/60; C30B 7/00; C30B 7/10
USPC ........................................................ 438/104
See application file for complete search history.

(56) References Cited

U.S. PATENT DOCUMENTS

| | | | |
|---|---|---|---|
| 2011/0008245 A1* | 1/2011 | Park ................... | B81C 1/00341 423/561.1 |
| 2011/0143464 A1* | 6/2011 | Chow .................... | B82Y 40/00 438/22 |
| 2011/0247548 A1* | 10/2011 | Jung ......................... | C30B 7/04 117/58 |
| 2013/0149844 A1* | 6/2013 | Kim ..................... | H01L 21/0237 438/478 |
| 2014/0291569 A1* | 10/2014 | Jeon ......................... | C01G 9/02 252/63.9 R |

OTHER PUBLICATIONS (Supportive Materials on Aug. 7, 2014) Hun Soo Jang et al., Controlled hydrothermal growth of multi-length-scale ZnO nanowires using liquid masking layers, Aug. 7, 2014, pp. 8000-8009, vol. 49, Springer.

* cited by examiner

*Primary Examiner* — Caleen Sullivan
(74) *Attorney, Agent, or Firm* — Hauptman Ham, LLP

(57) ABSTRACT

A method of preparing zinc oxide nanostructures using a liquid masking layer is disclosed. The method includes preparing a substrate having a zinc oxide seed layer formed thereon; loading the substrate in a reactor in which a lower liquid masking layer, a precursor liquid layer for hydrothermal growth, and an upper liquid masking layer are disposed in order; and forming zinc oxide nanostructures in a pattern on the substrate through hydrothermal growth by heating the precursor liquid layer for hydrothermal growth.

11 Claims, 8 Drawing Sheets

METHOD OF FABRICATING ZINC OXIDE NANOSTRUCTURES USING LIQUID MASKING LAYER

CROSS REFERENCE TO RELATED APPLICATION

This application claims the benefit of Korean Patent Application No. 10-2014-0138442, filed on Oct. 14, 2014, entitled "METHOD OF FABRICATING ZINC OXIDE NANOSTRUCTURES USING LIQUID MASKING LAYER", which is hereby incorporated by reference in its entirety into this application.

BACKGROUND

1. Technical Field

The present invention relates to a method of preparing zinc oxide nanostructures, and more particularly, to a method of preparing zinc oxide nanostructures through hydrothermal growth using a liquid masking layer.

2. Description of the Related Art

Zinc oxide nanostructures are Group II-IV compound semiconductors of a hexagonal crystal structure and exhibit excellent electrical, optical and catalytic properties due to wide band gap and high exciton energy characteristics thereof. Thus, zinc oxide nanostructures have been developed in various ways for application to next generation electronic, optoelectronic, and chemical fields. Particularly, due to luminous characteristics in the UV region, zinc oxide nanostructures have attracted attention in the fields of semiconductor devices, light emitting diodes, chemical sensors, and biosensors, and the like. In the related art, zinc oxide nanostructures are generally prepared through a top-down growth process in which a bulk source material is subjected to wet or dry etching or by a bottom-up growth process in which a vapor or liquid source material is subjected to physical and/or chemical coupling. As the bottom-up growth process, hydrothermal growth allows easy adjustment of various characteristics of zinc oxide nanostructures, such as size, shape, and impurity concentration of the zinc oxide nanostructures, and is advantageously performed at a relatively low process temperature to allow formation of zinc oxide nanostructures on the overall surface of a substrate irrespective of a source material of the zinc oxide nano structures.

However, a patterning technology used in a typical semiconductor process, such as photolithography, micro-contact printing, ink jet printing, and the like is generally performed on a planar substrate and thus has a limit in direct application to non-planar devices.

Therefore, there is a need for development of a technology for patterning zinc oxide nanostructures, which is compatible with various growth methods and synthesis methods and can be applied not only to planar substrates but also to non-planar substrates.

BRIEF SUMMARY

It is one aspect of the present invention to provide a method of preparing zinc oxide nanostructures, which can easily control the shape of nanostructures during hydrothermal growth and can form zinc oxide nanostructures through selective patterning on substrates having various surface shapes.

In accordance with one aspect of the present invention, there is provided a method of preparing zinc oxide nanostructures using a liquid masking layer, which includes: preparing a substrate having a zinc oxide seed layer formed thereon; loading the substrate in a reactor in which a lower liquid masking layer, a precursor liquid layer for hydrothermal growth, and an upper liquid masking layer are disposed in order; and forming zinc oxide nanostructures in a pattern on the substrate through hydrothermal growth by heating the precursor liquid layer for hydrothermal growth.

The lower liquid masking layer and the upper liquid masking layer may include materials not mixable with the precursor liquid layer for hydrothermal growth.

The lower liquid masking layer may include a material having a higher density than the precursor liquid layer for hydrothermal growth, and the upper liquid masking layer may include a material having a lower density than the precursor liquid layer for hydrothermal growth.

The precursor liquid layer for hydrothermal growth may include a zinc precursor liquid and an ammonia solution.

The zinc precursor liquid may include at least one selected from among zinc acetate ($Zn(CH_3CO_2)_2$), zinc nitrate ($Zn(NO_3)_2$), zinc sulfate ($ZnSO_4$), zinc chloride ($ZnCl_2$), and derivatives thereof.

The precursor liquid layer for hydrothermal growth may further include an additive for controlling a shape of the zinc oxide nanostructures.

The additive may include at least one selected from among polyethyleneimine, ethylenediamine, and sodium citrate.

The upper liquid masking layer may maintain a pH value within the reactor.

In formation of zinc oxide nanostructures in a pattern on the substrate through hydrothermal growth, the precursor liquid layer for hydrothermal growth may be heated to a temperature of 70° C. to 200° C.

A pattern pitch of the zinc oxide nanostructures formed on the substrate may be controlled by adjusting a height of the precursor liquid layer for hydrothermal growth to change a contact area between the substrate and the precursor liquid layer for hydrothermal growth.

In formation of zinc oxide nanostructures in a pattern on the substrate through hydrothermal growth, a pattern form of the zinc oxide nanostructures may be controlled by regulating a moving mode and a moving speed of the substrate within the reactor.

As such, the method according to the embodiments of the invention enables uniform formation of zinc oxide nanostructures on any type of substrate irrespective of a surface shape of the substrate including a planar shape and a non-planar shape by virtue of fluidity of upper and lower liquid masking layers and a precursor liquid layer for hydrothermal growth.

In addition, according to the embodiments of the present invention, a growth location and pattern of the zinc oxide nanostructures can be easily controlled through adjustment of the moving mode and moving speed of the substrate, or the height of the precursor liquid layer for hydrothermal growth.

Furthermore, according to the embodiments of the present invention, the upper liquid masking layer can effectively protect the precursor liquid layer for hydrothermal growth from external environments while stably maintaining pH and volume of the precursor liquid layer for hydrothermal growth.

The present invention is not limited to specific effects as mentioned above, and a person having ordinary knowledge in the art could clearly understand other advantageous effects from the following description.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1:
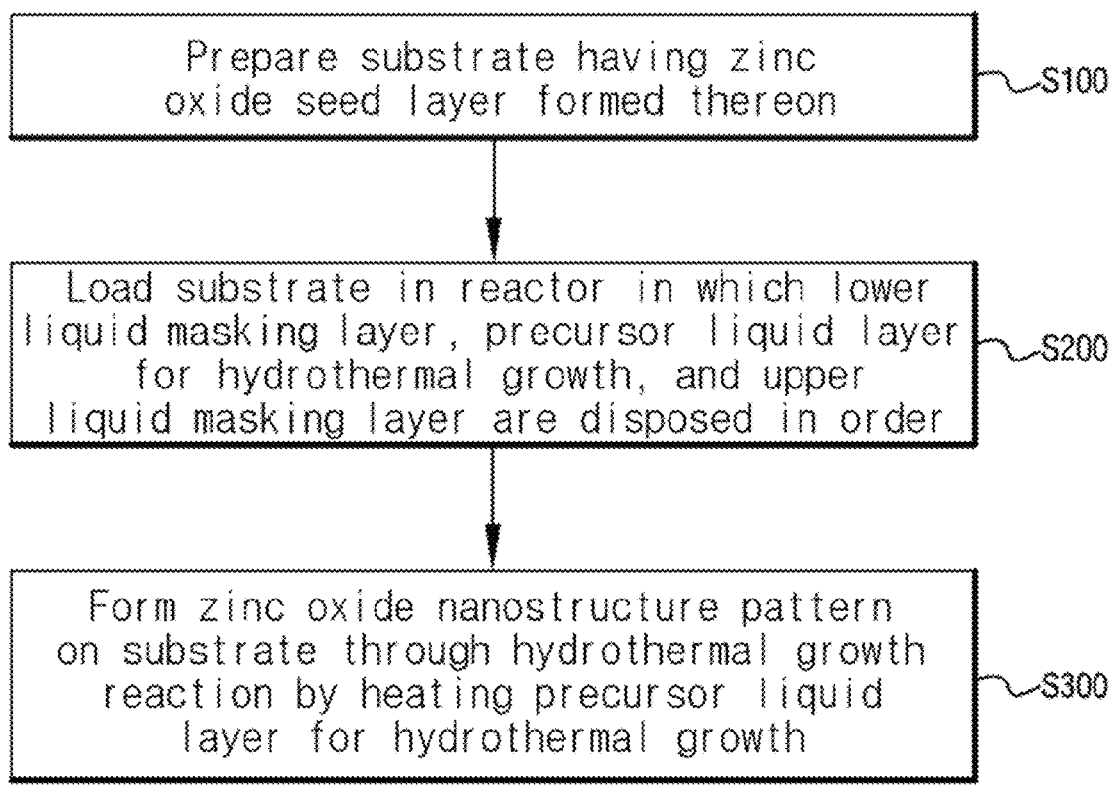
FIG. 1 is a flowchart illustrating a method of preparing zinc oxide nanostructures according to one embodiment of the present invention.

Hereinafter, exemplary embodiments of the present invention will be described in detail with reference to the accompanying drawings. The present invention can be modified and varied in various ways, and some specific embodiments are provided for illustration in the drawings and will be described in detail below. However, it should be understood that the present invention is not limited to specific embodiments and that various modifications can be made by those skilled in the art without departing from the scope of the present invention defined by the appended claims and equivalents thereof.

Herein, the drawings are not to precise scale and may be exaggerated or scaled down in thickness of layers and regions for clarity. Like components will be denoted by like reference numerals throughout the specification.

The present invention relates to a method of preparing zinc oxide nanostructures. Particularly, the present invention relates to a method of preparing zinc oxide nanostructures using a liquid masking layer, which includes: preparing a substrate having a zinc oxide seed layer formed thereon; loading the substrate in a reactor in which a lower liquid masking layer, a precursor liquid layer for hydrothermal growth, and an upper liquid masking layer are disposed in order; and forming zinc oxide nanostructures in a pattern on the substrate through hydrothermal growth by heating the precursor liquid layer for hydrothermal growth.

FIG. 1 is a flowchart illustrating a method of preparing zinc oxide nanostructures according to one embodiment of the present invention.

Referring to FIG. 1, in a method of preparing zinc oxide nanostructures according to one embodiment of the invention, first, a substrate having a zinc oxide seed layer is prepared (S100).

As the substrate, various kinds of substrates including a substrate applicable to semiconductor devices and electrical devices may be used. For example, the substrate may include a sapphire ($Al_2O_3$) substrate, a silicon (Si) substrate, a silicon carbide (SiC) substrate, a gallium nitride (GaN) substrate, and the like.

In some embodiments, before forming the zinc oxide seed layer on the substrate, a catalyst layer may be formed to facilitate formation of the zinc oxide seed layer. The catalyst layer may be composed of at least one selected from among, for example, silver (Ag), gold (Au), platinum (Pt), copper (Cu), aluminum (Al), iron (Fe), tin (Sn), nickel (Ni), chromium (Cr), and cobalt (Co), without being limited thereto.

The zinc oxide seed layer acts as a matrix for formation of zinc oxide nanostructures described below, and may be formed by a method for growing a zinc oxide seed layer well-known in the art. Specifically, the zinc oxide seed layer may be formed on the substrate by supplying a zinc source and an oxygen source, followed by thermal decomposition, chemical deposition, sol-gel, or sputtering, without being limited thereto.

Thereafter, referring to FIG. 1, the substrate is loaded in a reactor in which a lower liquid masking layer, a precursor liquid layer for hydrothermal growth, and an upper liquid masking layer are disposed in order, (S200).

Namely, the reactor in which hydrothermal growth will be performed is prepared. Then, the lower liquid masking layer, the precursor liquid layer for hydrothermal growth, and the upper liquid masking layer are sequentially placed in an upward direction within the reactor, and the substrate having the zinc oxide seed layer formed thereon is disposed in the reactor. The lower liquid masking layer and the upper liquid masking layer mean masking layers in a liquid phase, and thus have fluidity unlike a solid mask to make uniform contact with the substrate regardless of the shape of the substrate (planar or non-planar substrate).

The lower liquid masking layer and the upper liquid masking layer may be composed of materials that are not mixable with the precursor liquid layer for hydrothermal growth. As a result, hydrothermal growth can occur only on the precursor liquid layer for hydrothermal growth disposed between the lower liquid masking layer and the upper liquid masking layer, thereby allowing selective growth of the zinc oxide nanostructures in particular regions on the substrate. That is, the lower liquid masking layer and the upper liquid masking layer may be composed of materials having a low coefficient of distribution with a material of the precursor liquid layer for hydrothermal growth in order to prevent influence on hydrothermal growth reaction while protecting the precursor liquid layer for hydrothermal growth from external environments.

Further, the lower liquid masking layer may be composed of a material having a higher density than the precursor liquid layer for hydrothermal growth, and the upper liquid masking layer may be composed of a material having a lower density than the precursor liquid layer for hydrothermal growth. As a result, the lower liquid masking layer, the precursor liquid layer for hydrothermal growth, and the upper liquid masking layer may be sequentially disposed in the reactor from a lower portion of the reactor to an upper portion thereof in an upward direction. As such, due to the densities and characteristics of the materials for the upper and lower liquid masking layers, the upper and lower liquid masking layers can be stably placed without being mixed with the precursor liquid layer for hydrothermal growth, whereby a desired pattern of the zinc oxide nanostructures can be formed in a desired pitch on the substrate.

Accordingly, the lower liquid masking layer and the upper liquid masking layer may be composed of any materials which satisfy the aforementioned characteristics or conditions.

For example, the lower liquid masking layer may include at least one selected from among chlorobenzene, 1-chloro-2-chloromethylbenzene, 4-chloro-1,2-dimethylbenzene, 1-chloro-2-ethylbenzene, 1-chloro-3-ethylbenzene, 1-chloro-4-ethylbenzene, 1-chloro-2-fluorob enzene, 1-chloro-3-fluorobenzene, 1-chloro-4-fluorobenzene, chloromethylbenzene, 2-chlorotoluene, 3-chlorotoluene, 4-chlorotoluene, 1,2-dichlorobenzene, 1,3-dichlorobenzene, 1,4-dichlorobutane, 3,4-dichloro-1-butene, dichloromethylbenzene, 1,5-dichloropentane, 2,3-dichloropentane, 2,2-dichloropropane, 2,4-dichlorotoluene, 3,4-dichlorotoluene, 1,2-dimethylnaphthalene, 1,3-dimethylnaphthalene, 1,4-dimethylnaphthalene, 1,6-dimethylnaphthalene, 1,7-dimethylnaphthalene, 1-fluoronaphthalene, 2-fluoronaphthalene, hexachloro-1,3-butadiene, hexachloropropene, 1-methylnaphthalene, pentachloroethane, tetrachloroethene, 1,1,1,2-tetrachloropropane, 1,1,1,3-tetrachloropropane, 1,1,2,3-tetrachloropropane, 1,2,2,3-tetrachloropropane, 1,1,2-trichloroethane, trichloromethylbenzene, and 3,3,3-trichloro-1-propene.

In addition, for example, the upper liquid masking layer may include at least one selected from among 2-propenyl benzene, methoxybenzene, 1-butenylbenzene, 2-butenylbenzene, 3-butenyl benzene, butyl acrylate, butyl benzene, butyl benzoate, butyl butanoate, butyl cyclohexane, butyl hexanoate, 1-tert-butyl-4-methylbenzene, 1-butyl naphthalene, 2-butyl naphthalene, 2-butyl phenol, 1-chlorobutane, 1-chlorodecane, 1-chlorododecane, 1-chloroheptane, 1-chlorohexane, 2-chlorohexane, 3-chlorohexane, 1-chloro-2-isopropylbenzene, 1-chloro-4-isopropylbenzene, 1-chlorononane, 1-chlorooctade cane, 1-chlorooctane, 2-chlorooctane, cycloheptane, cycloheptene, cyclopentanone, cyclopropylbenzene, decahydronaphthalene, decane, 1-decene, 2-decene, 5-decene, 1-decyne, 5-decyne, 1,2-diethylbenzene, 1,3-diethylbenzene, 1,4-diethylbenzene, 1,3-diethyl-5-methylbenzene, 3,3-diethylpentane, 1,2-diisopropylbenzene, 1,3-diisopropylbenzene, 1,4-diisopropylbenzene, 1,1-dimethylcyclohexane, 1,2-dimethylcyclohexane, 1,3-dimethylcyclohexane, 1,4-dimethylcyclohexane, 2,2-dimethylheptane, 2,3-dimethylheptane, 2,4-dimethylheptane, 2,5-dimethyl-1,5-hexadiene, 2,5-dimethylhexane, 3,3-dimethylhexane, 3,4-dimethylhexane, 1-dodecene, ethylbenzene, ethylcyclohexane, 1-ethyl-3,5-dimethylbenzene, 2-ethyl-1,4-dimethylb enzene, 4-ethyl-1,2-dimethylbenzene, 3-ethyl-2-methylpentane, 3-ethyl-3-methylpentane, 2-ethyltoluene, 3-ethyltoluene, 4-ethyltoluene, 1-fluoroheptane, 1,6-heptadiyne, 2,6,10,15,19,23-hexamethyltetracosane, hexadecane, hexylbenzene, isobutylbenzene, isobutylcyclohexane, isopropenylbenzene, isopropylbenzene, isopropylcyclopentane, 1-isopropyl-2-methylbenzene, 1-isopropyl-3-methylbenzene, 1-isopropyl-4-methylbenzene, 2-methylheptane, 3-methylheptane, 4-methylheptane, 1-methyl-4-isopropylcyclohexane, 2-methylnonane, 3-methylnonane, 4-methylnonane, 5-methylnonane, 2-methyloctane, 3-methyloctane, 4-methyloctane, 1-methyl-1-propenylbenzene, 1-methyl-4-propylb enzene, 2-methylstyrene, 3-methylstyrene, 4-methylstyrene, 1,8-nonadiyne, nonane, 1-nonyne, octane, 1-octene, 2-octene, 3-octene, 4-octene, 1-octyne, 2-octyne, 3-octyne, 4-octyne, 1-pentadecene, pentylbenzene, pentylcyclopentane, phenyl acetylene, pinene, 1-propenylbenzene, propylbenzene, propylcyclohexane, propylcyclopentane, styrene, tetradecahydrophenanthrene, 1-tetradecene, 1,2,3,4-tetramethylbenzene, 1,2,3,5-tetramethylbenzene, 2,2,4,4-tetramethylpentane, toluene, tridecane, 1-tridecene, 1,3,5-triethylbenzene, 1,2,3-trimethylbenzene, 1,2,4-trimethylbenzene, ,2,3-trimethylbenzene, 1,1,3-trimethylcyclohexane, 2,2,5-trimethylhexane, 2,2,3-trimethylpentane, 2,3,3-trimethylpentane, 2,3,4-trimethylpentane, undecane, 1-undecene, 4-vinylcyclohexene, and xylene.

In one embodiment of the invention, the lower liquid masking layer may be composed of 1,2-dichlorobenzene. Specifically, 1,2-dichlorobenzene has a low solubility of $5.5 \times 10^{-7}$ at 100° C. and thus is not mixable with the precursor liquid layer for hydrothermal growth. In addition, 1,2-dichlorobenzene has a density of 1.306 g/mol at 25° C., which is higher than that of water, and thus can be used as a material for the lower liquid masking layer. In one embodiment of the invention, the upper liquid masking layer may be composed of mineral oil. Specifically, mineral oil has a low solubility of $5 \times 10^{-1}$° to $7 \times 10^{-11}$ at 100° C. and thus is not mixable with the precursor liquid layer for hydrothermal growth and has a density of 0.773 g/mol at 25° C., which is lower than that of water, and thus can be used as a material for the upper liquid masking layer.

The precursor liquid layer for hydrothermal growth is provided for hydrothermal growth reaction in operation of forming zinc oxide nanostructures described below, and may include a zinc precursor liquid and an ammonia solution.

As used in the precursor liquid layer for hydrothermal growth, the zinc precursor liquid serves to provide zinc ions for the hydrothermal growth reaction, and may be a distilled water solution in which a zinc precursor is dissolved. Specifically, the zinc precursor liquid may include at least one selected from zinc acetate ($Zn(CH_3CO_2)_2$), zinc nitrate ($Zn(NO_3)_2$), zinc sulfate ($ZnSO_4$), zinc chloride ($ZnCl_2$), and derivatives thereof As used in the precursor liquid layer for hydrothermal growth, the ammonia solution may include a mixture of NaOH, $NH_4OH$ or an amine compound with an aqueous solution, without being limited thereto. The ammonia solution is provided for pH adjustment of the precursor liquid layer for hydrothermal growth and can provide hydroxyl ions to the precursor liquid layer during hydrothermal growth reaction. Generally, surface charges of the zinc oxide nanostructures can differ according to the pH value of the precursor liquid layer for hydrothermal growth, and may act as an important factor that determines the pattern form of the zinc oxide nanostructures. Thus, a suitable pH value for formation of a desired shape of the nanostructures can be maintained in hydrothermal growth reaction, thereby improving yield of the zinc oxide nanostructures.

The precursor liquid layer for hydrothermal growth may further include an additive for controlling the shape of the zinc oxide nanostructures. Specifically, when the precursor liquid layer further includes the additive, it is possible to form the zinc oxide nanostructures in a desired shape. In one embodiment, the additive may include at least one of polyethylene imine, ethylenediamine, and sodium citrate.

According to embodiments of the invention, the pH value of the precursor liquid layer can be maintained within the reactor by the upper liquid masking layer. Specifically, the upper liquid masking layer prevents ammonia generated by hydrothermal growth reaction from being evaporated from the precursor liquid layer, and may maintain the pH value of the precursor liquid layer. In addition, since the volume of the precursor liquid layer is maintained by preventing evaporation of ammonia therefrom, a contact area between the precursor liquid layer and the substrate is not significantly changed, whereby the zinc oxide nanostructures can be stably formed in a desired size and shape. Then, referring to FIG. 1, the precursor liquid layer for hydrothermal growth is heated to form zinc oxide nanostructures in a pattern on the substrate through hydrothermal growth (S300).

That is, with the substrate having the zinc oxide seed layer loaded in the reactor in which the lower liquid masking layer, the precursor liquid layer, and the upper liquid masking layer are disposed in order through S100 and S200, hydrothermal growth reaction may occur by heating the precursor liquid layer. As a result, the zinc oxide nanostructures can be formed in a certain pattern on the zinc oxide seed layer on the substrate.

In one embodiment of the invention, in formation of the zinc oxide nanostructures in a certain pattern on the substrate through hydrothermal growth by heating the precursor liquid layer for hydrothermal growth, the precursor liquid layer may be heated to a temperature of 70° C. to 200° C. Here, the precursor liquid layer may be heated using any hydrothermal growth apparatus well known in the art. For example, the reactor accommodating the precursor liquid layer for hydrothermal growth may be heated in an oven, without being limited thereto.

When the precursor liquid layer for hydrothermal growth is heated, the hydrothermal growth reaction is carried out, thereby forming the zinc oxide nanostructures in a certain pattern and/or in a specific shape on the substrate. Specifically, as the precursor liquid layer for hydrothermal growth is heated, ammonium ions and hydroxyl ions are generated through reaction water molecules and ammonia contained in the ammonia solution, and the generated hydroxyl ions react with zinc ions contained in the zinc precursor liquid to generate zinc hydroxide. The generated zinc hydroxide is grown on the zinc oxide seed layer formed on the substrate to form the zinc oxide nanostructures.

According to the present invention, a pattern pitch of the zinc oxide nanostructures formed on the substrate may be controlled by adjusting a height of the precursor liquid layer for hydrothermal growth to change a contact area between the substrate and the precursor liquid layer for hydrothermal growth in the reactor. Specifically, this is because the zinc oxide nanostructures are formed on the substrate through hydrothermal growth reaction that occurs only on a region of the substrate contacting the precursor liquid layer for hydrothermal growth within the reactor.

That is, when the height of the precursor liquid layer for hydrothermal growth disposed between the lower liquid masking layer and the upper liquid masking layer is adjusted, the contact area between the substrate and the precursor liquid layer for hydrothermal growth is changed, thereby controlling the pattern pitch of the zinc oxide nanostructures formed on the substrate.

Further, in the operation of forming the zinc oxide nanostructures in a certain pattern on the substrate, a pattern form of the zinc oxide nanostructures may be controlled by regulating a moving mode and a moving speed of the substrate within the reactor. Specifically, the zinc oxide nanostructures may be formed in various pattern forms on the substrate by regulating the moving mode and moving speed of the substrate within the reactor.

That is, since all of the lower liquid masking layer, the precursor liquid layer and the upper liquid masking layer are provided in a liquid phase having fluidity, the lower liquid masking layer, the precursor liquid layer and the upper liquid masking layer can uniformly contact the surface of the substrate irrespective of the shape of the substrate. Thus, when the disposition of the substrate is changed through regulation of the moving mode and moving speed of the substrate, the pattern of the zinc oxide nanostructures can be changed according to a location of the zinc oxide nanostructures formed on the substrate and time for which the zinc oxide nanostructures are formed in a certain region of the substrate by movement of the substrate.

For example, when the substrate is continuously moved within the reactor, the zinc oxide nanostructures may be formed in a nanoline shape, the length of which gradually increases. In addition, for example, when the substrate is moved stepwise within the reactor, the zinc oxide nanostructures may be formed in a two-dimensional pattern of a nanoline shape, the length of which increases stepwise. Further, when the substrate is spirally rotated within the reactor, the zinc oxide nanostructures may be formed in a three-dimensional pattern of a spiral shape.

The method of preparing zinc oxide nanostructures using a liquid masking layer according to the present invention may be broadly applied not only to the preparation of zinc oxide nanostructures, but also to the preparation of thin film type nanoparticles, and a process, such as etching, which employs a different kind of solution from that used in the preparation of zinc oxide nanostructures. Further, the zinc oxide nanostructures may be directly applied to semiconductor devices, LEDs, photodetectors, sensors, and the like, which include substrates having various surface shapes, thereby enlarging application ranges thereof.

EXAMPLE

Example 1

Preparation of Zinc Oxide Nanostructures Using Upper/Lower Liquid Masking Layer

Figure 2:
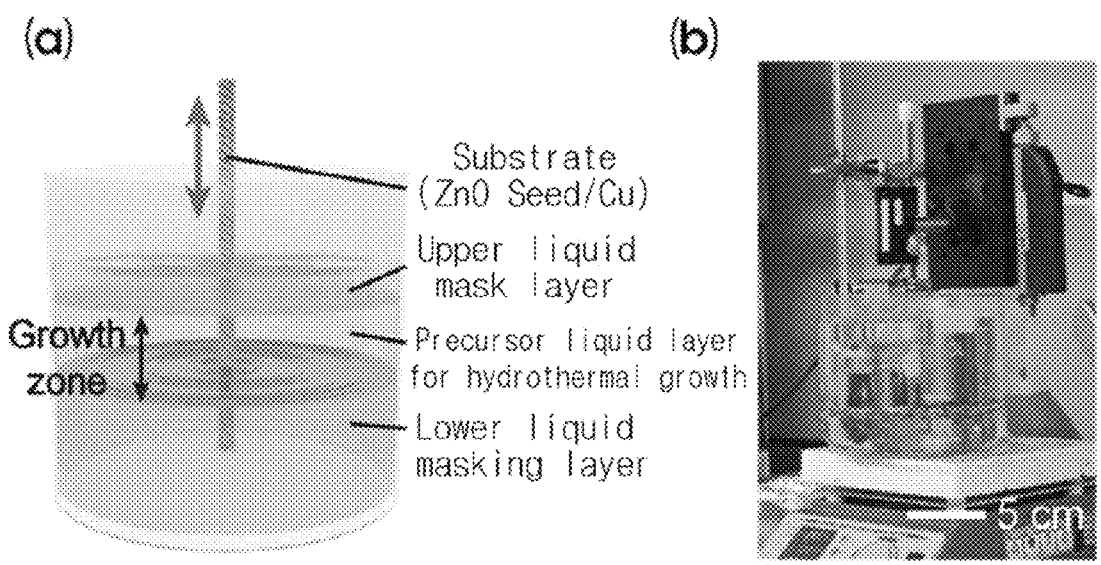
FIG. 2 shows pictures illustrating a method of preparing zinc oxide nanostructures in Example 1.

FIG. 2 shows pictures illustrating a method of preparing zinc oxide nanostructures in Example 1.

Referring to FIG. 2(a), a twisted copper wire prepared as a substrate was coated with silver (Ag), followed by formation of a zinc oxide seed layer thereon. First, 1,2-dichlorobenzene was placed as a lower liquid masking layer in a flask as a reactor, and a precursor solution for hydrothermal growth prepared by mixing zinc nitrate ($Zn(NO_3)_2$, an ammonia solution, and polyethylene imine was added to the flask. Then, mineral oil was placed as an upper liquid masking layer on the precursor liquid layer for hydrothermal growth, and the copper wire was placed in the flask. Then, as shown in FIG. 2(b), in order to heat the precursor liquid layer for hydrothermal growth placed in flask, the flask was heated to a temperature of 72° C. to 85° C. by water bath in an oven. Here, in the copper wire used as the substrate, a contact area between the precursor liquid layer for hydrothermal growth and the substrate was divided into four regions, and hydrothermal growth time in each region of the contact area was divided into four steps. The substrate was moved at a speed of 5 mm/s. A first step was set to 1.5 h (90 min.), a second step was set to 0.5 h (30 min), a third step was set to 1 h (60 min), and a fourth step was set to 0.5 h (30 min).

Figure 3:
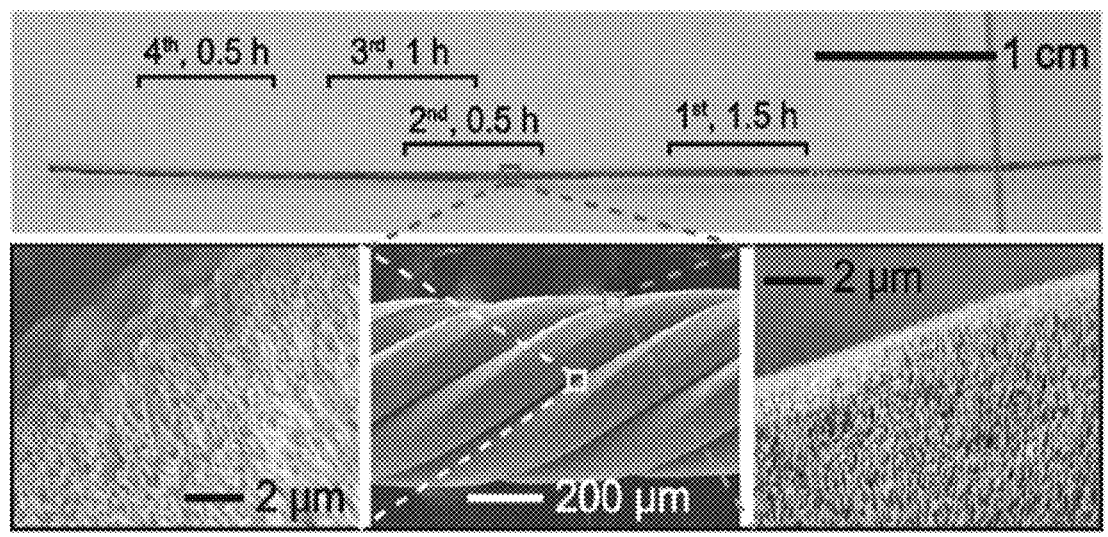
FIG. 3 shows pictures of a substrate having zinc oxide nanostructures prepared in Example 1.

FIG. 3 shows pictures of a substrate having zinc oxide nanostructures prepared in Example 1.

Referring to FIG. 3, it can be seen that the zinc oxide nanostructures were formed in a specific region on the substrate, as the substrate was moved in each step. Comparing a portion of the copper wire corresponding to the first step in which the time for wire hydrothermal growth reaction was long with a portion of the copper wire corresponding to the fourth step in which the time for wire hydrothermal growth reaction was short, it can be observed with the naked eye that the portions of the copper wire had different states. This result may mean that zinc oxide nanostructures grown on the portion of the copper wire corresponding to the first step was longer than the zinc oxide nanostructures grown on the portion of the copper wire corresponding to the fourth step. In enlarged images at a lower side of FIG. 3, it can be seen that the zinc oxide nanostructures were uniformly formed on each portion of the twisted copper wire.

As such, the method of preparing zinc oxide nanostructures according to the present invention can secure uniform growth of the zinc oxide nanostructures on any substrate having a non-planar or complex surface shape, and can control the shape of the zinc oxide nanostructures through change of the contact area between the precursor liquid layer for hydrothermal growth and the substrate by changing the disposition of the substrate through regulation of the moving mode and moving speed of the substrate.

Example 2

Preparation of Zinc Oxide Nanostructures Using Upper Liquid Masking Layer

Zinc oxide nanostructures were prepared using only an upper liquid masking layer in the same manner as in Example 1 except that 1,2-dichlorobenzene, that is, the lower liquid masking layer, was not placed in the reactor (the fourth step of Example 1 was not performed either).

Comparative Example 1

Preparation of Zinc Oxide Nanostructures Without Using Upper Liquid Masking Layer Zinc oxide nanostructures were prepared without using a liquid masking layer in the same manner as in Example 1 except that mineral oil and 1,2-dichlorobenzene, that is, the upper and lower liquid masking layers, were not placed in the reactor (the fourth step of Example 1 was not performed either).

Figure 4:
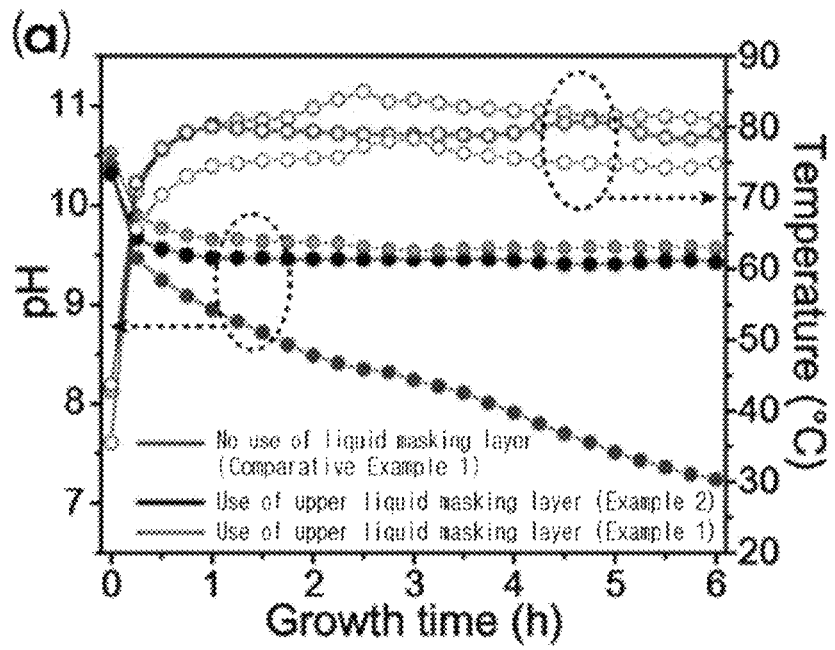
FIG. 4 shows a graph depicting relationship between pH and hydrothermal growth time in Example 1, Example 2, and Comparative Example 1, and pictures showing volume change of each solution in a reactor and zinc oxide nanostructures prepared in Example 1, Example 2 and Comparative Example 1.
Figure 4:
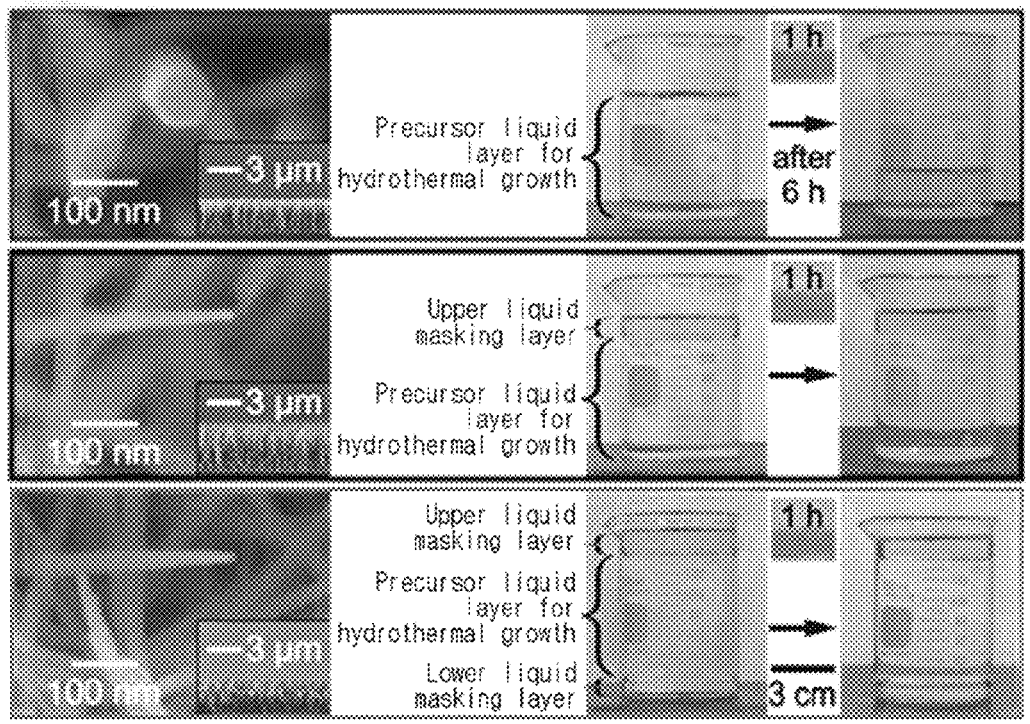

FIG. 4 shows a graph depicting relationship between pH and hydrothermal growth time in Example 1, Example 2, and Comparative Example 1, and pictures showing volume change of each solution in a reactor and zinc oxide nanostructures prepared in Example 1, Example 2 and Comparative Example 1.

Referring to FIG. 4(a), in Comparative Example 1 in which the liquid masking layer was not used, it can be seen that the pH value decreased with increasing hydrothermal growth time. On the contrary, in Example 2 in which the upper liquid masking layer was used and in Example 1 in which the upper and lower masking layers were used, it can be seen that the pH value was maintained without significant change even with increasing hydrothermal growth time. It is believed that, since the liquid masking layer prevented evaporation of ammonia upon hydrothermal growth reaction, the pH value of the precursor liquid layer for hydrothermal growth was maintained. Further, referring to the graph depicting relationship between temperature and hydrothermal growth time, in Comparative Example 1 in which the liquid masking layer was not used, it can be seen that the temperature of the precursor liquid layer was maintained at about 70° C. due to heat loss resulting from evaporation of water used as a solvent. On the contrary, in Example 2 in which the upper liquid masking layer was used and in Example 1 in which the upper and lower masking layers were used, it can be seen that, since the upper liquid masking layer suppressed evaporation of the solvent to allow the temperature of the precursor liquid layer to be maintained at about 85° C. even with increasing hydrothermal growth time.

Left images of FIG. 4(b) show shapes of zinc oxide nanostructures prepared in Comparative Example 1, Example 2, and Example 1, and it can be seen that the zinc oxide nanostructures of Comparative Example 1 have a hexagonal column shape. That is, even under an initial pH condition allowing formation of needle-shaped zinc oxide nanostructures, when the liquid masking layer was not used, the pH value of the precursor liquid layer, on which hydrothermal growth reaction occurs, was reduced to pH 8.7 or less, which corresponds to a point of zero charge of zinc oxide. As a result, it can be understood that electrostatic attraction between side surfaces of the zinc oxide nanostructures and polyethylene imine contained in the precursor liquid layer was not maintained, whereby suppression of lateral growth of the zinc oxide nanostructures was reduced to allow the zinc oxide nanostructures to be grown in a hexagonal column shape.

On the contrary, in Examples 1 and 2, it can be understood that the needle-shaped zinc oxide nanostructures were formed, since the liquid masking layer maintained the pH value of the precursor liquid layer for hydrothermal growth to suppress lateral growth of the zinc oxide nanostructures. Obviously, even under an initial pH reaction condition of about 7, the hexagonal column-shaped zinc oxide nanostructures can be easily formed.

Right images of FIG. 4(b) show volume change of the zinc oxide nanostructures in the reactor in Comparative Example 1, Example 2, and Example 1. In Comparative Example 1 in which the liquid masking layer was not used, it can be seen that the volume of the precursor liquid layer for hydrothermal growth was significantly reduced over time. On the contrary, in Examples 1 and 2, it can be seen that the volume of the precursor liquid layer for hydrothermal growth was substantially maintained in the reactor.

As such, according to the present invention, the pH value and volume of the precursor liquid layer for hydrothermal growth are maintained by the liquid masking layer to allow hydrothermal growth reaction to occur in a stable state, thereby allowing easy formation of zinc oxide nanostructures having a desired shape.

Example 3

Preparation of Zinc Oxide Nanostructures (1) by Changing Disposition of Substrate Zinc oxide nanostructures were prepared without using a liquid masking layer in the same manner as in Example 1 except that the substrate was moved at speeds of 1 μm/s, 2 μm/s and 3 μm/s to change the disposition of the substrate contacting the precursor liquid layer for hydrothermal growth (the fourth step of Example 1 was not performed either).

Figure 5:
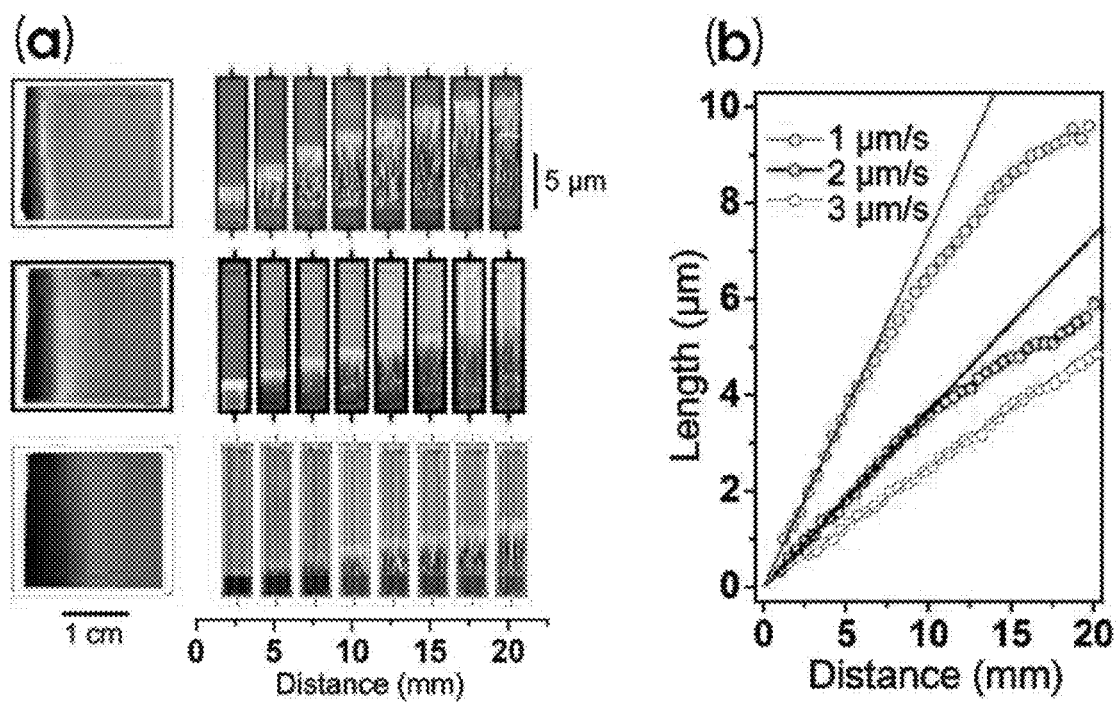
FIG. 5 shows pictures of zinc oxide nanostructures prepared in Example 3 and a graph depicting relationship between length distribution of the zinc oxide nanostructures and moving speed of a substrate in Example 3.

FIG. 5 shows pictures of zinc oxide nanostructures prepared in Example 3 and a graph depicting relationship between length distribution of the zinc oxide nanostructures and moving speed of the substrate in Example 3.

Referring to FIG. 5(a), it can be seen from all three images that, as the substrate was moved, the length of the zinc oxide nanostructures was continuously increased. In addition, it can be seen that, as the moving speed of the substrate increased to 1 μm/s, 2 μm/s and 3 μm/s, the length of the zinc oxide nanostructures was decreased. That is, when the substrate was moved at a moving speed of 1 μm/s, a contact time between the substrate and the precursor liquid layer for hydrothermal growth was increased, thereby forming long zinc oxide nanostructures.

Referring to FIG. 5(b), an increase gradient of length to distance of the substrate was about 0.74 μm/mm at a moving speed of 1 μm/s, about 0.37 μm/mm at a moving speed of 2 μm/s, and about 0.25 μm/mm at a moving speed of 3 μm/s. Thus, it can be confirmed that the increase gradient of length to distance of the substrate is inversely proportional to the moving speed of the substrate. However, since the zinc oxide nanostructures have a constant growth speed of 2.6 μm/h with respect to hydrothermal growth time irrespective of the moving speed of the substrate, it can be seen that a growth pattern of the zinc oxide nanostructures depending on the substrate distance can be controlled based on the disposition of the substrate (the moving mode and moving speed of the substrate).

Example 4

Preparation of Zinc Oxide Nanostructures (2) by Changing Disposition of Substrate Zinc oxide nanostructures were prepared in the same manner as in Example 1 except that the substrate was brought into contact with the precursor liquid layer for hydrothermal growth for 1 hour, moved at a speed of 0.1 mm/s, and then brought into contact with the precursor liquid layer for 1 hour (the fourth step of Example 1 was not performed either).

Example 5

Preparation of Zinc Oxide Nanostructures (3) by Changing Disposition of Substrate Zinc oxide nanostructures having various lengths were prepared in the same manner as in Example 1 except that the substrate was brought into contact with the precursor liquid layer for hydrothermal growth for 1 hour, 1.5 hours and 2 hours to form zinc oxide nanostructures, and rotated 90° to repeat hydrothermal growth reaction in the same way (the fourth step of Example 1 was not performed either).

Figure 6:
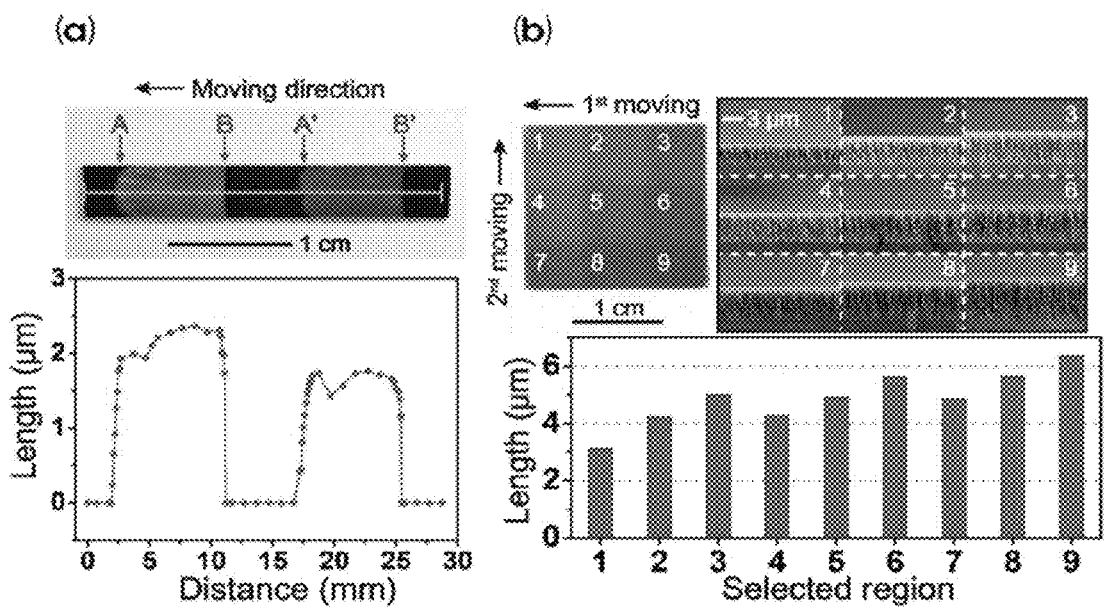
FIG. 6 shows pictures of zinc oxide nanostructures prepared in Example 4 and Example 5 and a graph depicting length distribution of the zinc oxide nanostructures.

FIG. 6 shows pictures of zinc oxide nanostructures prepared in Example 4 and Example 5 and a graph depicting length distribution of the zinc oxide nanostructures.

Referring to FIG. 6(a), a region indicated by A or A' is an interface between the precursor liquid layer for hydrothermal growth and the lower liquid masking layer, and a region indicated by B or B' is an interface between the precursor liquid layer for hydrothermal growth and the upper liquid masking layer. In the graph at the lower side of FIG. 6(a), it can be seen that the length of the zinc oxide nanostructures was significantly increased at the interface according to the disposition of the substrate. Specifically, the increase gradient was about 2.9 μm/mm at A and 17.3 μm/mm at B.

FIG. 6(b) shows a graph depicting a step-type length distribution of the zinc oxide nanostructures prepared in Example 5, in which the length distribution of the zinc oxide nanostructures is composed of 9 regions. An overall hydrothermal growth time ranges from 2 hours to 4 hours. Thus, although sequence of the hydrothermal growth reaction occurring on the substrate differs according to the distance of the substrate, it can be seen that there are regions having the same overall hydrothermal growth time at each distance and the zinc oxide nanostructures grown in these regions have substantially the same length with a slight difference of about 1%.

In addition, the method according to the present invention allows the length distribution of the zinc oxide nanostructures to be divided into 9 regions through a simple process of moving the substrate twice, thereby providing an effect of more easily controlling the pattern pitch and the pattern form of the zinc oxide nanostructures.

Example 6

Preparation of Zinc Oxide Nanostructures (4) by Changing Disposition of Substrate Zinc oxide nanostructures having various lengths were prepared in the same manner as in Example 1 except that the substrate was spirally disposed and moved (the fourth step of Example 1 was not performed either).

Figure 7:
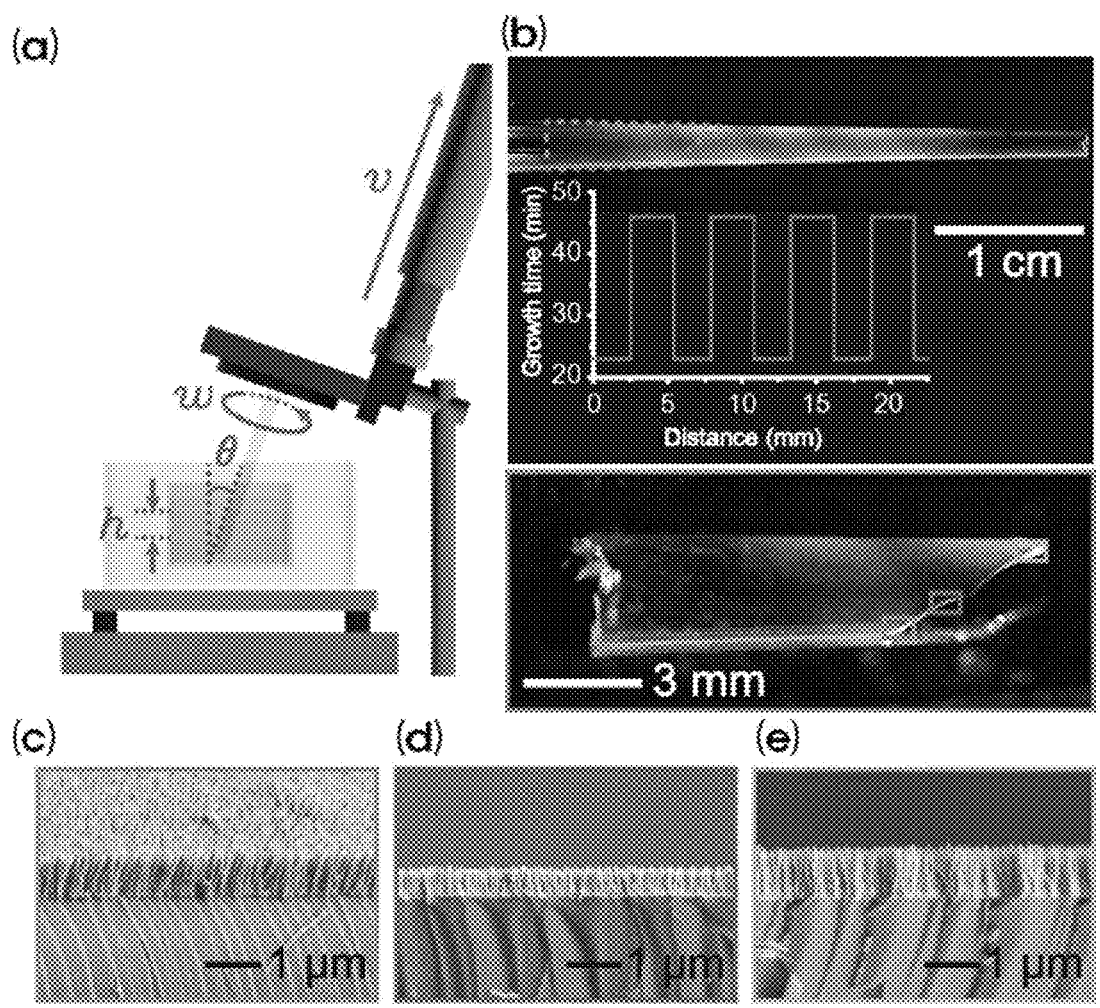
FIG. 7 shows an apparatus for preparing zinc oxide nanostructures used in Example 6 and pictures of the zinc oxide nanostructures prepared thereby.

FIG. 7 shows an apparatus for preparing zinc oxide nanostructures used in Example 6 and pictures of the zinc oxide nanostructures prepared thereby.

Referring to FIG. 7(a), in Example 6, a Pasteur pipette was disposed as a substrate in a diagonal direction within a reactor and rotated by a rotating device. When h is a height of the precursor liquid layer for hydrothermal growth between the upper and lower liquid masking layers and θ is an angle defined between the surface of the precursor liquid layer for hydrothermal growth and a virtual vertical line, the width of zinc oxide nanostructures formed on the substrate may be defined by $$W_{stripe} = \frac{h}{\cos\theta}.$$

In addition, when a linear movement speed and a rotating speed of the substrate are $\upsilon$ and $\omega$, respectively, the rotational period of stripe type zinc oxide nanostructures may be defined by $$P = 2\pi\frac{\upsilon}{\omega}.$$

At this time, when the width of the stripe type zinc oxide nanostructures is coincident with the rotational period thereof, the pattern of the zinc oxide nanostructures is not formed and the zinc oxide nanostructures can be generally uniformly formed.

On the other hand, when the width of the stripe type zinc oxide nanostructures is greater than the rotational period thereof, the stripe type zinc oxide nanostructures are grown to overlap each other, and when the width of the stripe type zinc oxide nanostructures is less than the rotational period thereof, there can be a region of the substrate on which the zinc oxide nanostructures are not grown. The growth time of the stripe type zinc oxide nanostructures may be represented by $$t = \frac{h}{\upsilon\cos\theta}.$$

FIG. 7(b) to FIG. 7(e) show pictures of zinc oxide nanostructures formed in a spiral stipe pattern on the Pasteur pipette. As described above, in a region in which the zinc oxide nanostructures were grown to overlap each other in a stripe pattern, the growth time is doubled. Thus, it can be confirmed that the zinc oxide nanostructures have a length of about 0.46 μm in FIG. 7(d) and a length of about 0.88 μm in FIGS. 7(c) and 7(e).

Example 7-1

Fabrication of Photodetector Using Zinc Oxide Nanostructures

After deposition of chromium (Cr) patterns at an interval of 120° and a zinc oxide seed layer on a cylindrical glass substrate using a sputter, zinc oxide nanostructures were grown on the cylindrical glass substrate using mineral oil as an upper liquid masking layer, 1,2-dichlorobenzene as a lower liquid masking layer, and a mixed solution of a zinc nitrate solution and an ammonia solution as a precursor liquid for hydrothermal growth as in Example 1.

Then, a p-n junction photodetector was fabricated by coating poly(3-hexylthiophene-2,5-diyl) (P3HT) as a p-type semiconductor material, and coating poly(3,4-ethylenedioxythiophene)-poly(styrenesulfonate) (PEDOT:PSS) as an upper electrode material.

Example 7-2

Fabrication of Cylindrical Photodetector Using Zinc Oxide Nanostructures

A p-n junction photodetector was fabricated in the same manner as in Example 7-1 except that, upon formation of the zinc oxide nanostructures on the cylindrical glass substrate, the substrate was moved between the liquid masking layer and the precursor liquid layer for hydrothermal growth such that the zinc oxide nanostructures could be grown to overlap each other on the substrate.

Figure 8:
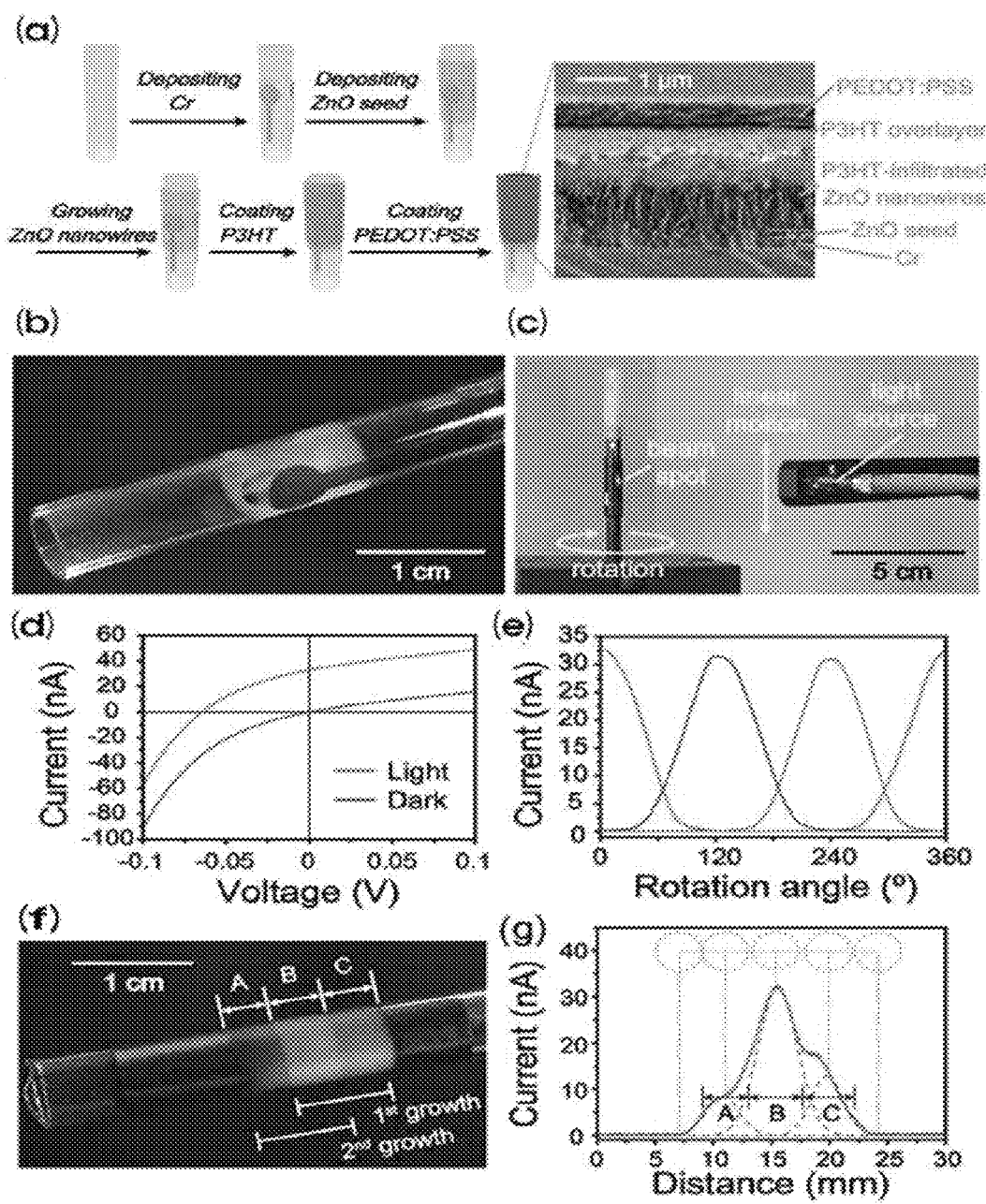
FIG. 8 shows a diagram of a method of fabricating a photodetector using zinc oxide nanostructures prepared in Example 7-1 and Example 7-2, pictures illustrating a method for evaluating photo-response characteristics of the photodetector, and a graph depicting evaluation results.

FIG. 8 shows a diagram of a method of fabricating a photodetector using zinc oxide nanostructures prepared in Example 7-1 and Example 7-2, pictures illustrating a method of evaluating photo-response characteristics of the photodetector, and a graph depicting evaluation results.

FIG. 8(a) shows a diagram illustrating the method of fabricating a photodetector in Example 7-1 and an SEM image of the photodetector fabricated using the prepared zinc oxide nanostructures.

Specifically, in Example 7-1, the zinc oxide nanostructures were selectively formed on some part of the cylindrical glass substrate, as shown in FIG. 8(b). Thus, it can be confirmed that the method of preparing zinc oxide nanostructures using a liquid masking layer according to the present invention allows the zinc oxide nanostructures to be selectively formed on a curved substrate without an additional patterning process.

FIG. 8(c) is a picture of a test set for evaluation of photo-response characteristics of the cylindrical photodetector, which can regulate rotation about the center of curvature of the photodetector and linear movement of a light source in a longitudinal direction of the photodetector.

FIG. 8(d) shows a current-voltage curve of the cylindrical photodetector as measured using the test set shown in FIG. 8(c), and it can be seen that the current-voltage curve exhibits characteristics of a typical p-n junction light reception diode. As a result, it can be seen that the photodetector was fabricated to act as a general p-n junction light reception diode.

FIG. 8(e) shows a photo-response curve upon rotation of the photodetector, in which a chromium (Cr) pattern has a diameter of 5 mm, a light source has a diameter of 4 mm, and zinc oxide nanostructures have an average length of 1.7 μm.

In this test, current signals have an interval of 120°, which is the same as a pitch of the chromium pattern and a difference between the respective signals is within 4.9%, which means that the current signals are substantially constant.

FIG. 8(f) shows an image of the zinc oxide nanostructures formed on the cylindrical glass substrate in Example 7-2, and it can be seen that the zinc oxide nanostructures were grown in overlapping regions on the substrate. Specifically, in FIG. 8(f), the zinc oxide nanostructures formed on regions indicated by A, B and C have average lengths of 0.6 μm, 1.7 μm, and 1.1 μm, respectively.

FIG. 8(g) is a graph depicting current signals of the photodetector fabricated in Example 7-2, and it can be seen that current signals in the regions indicated by A, B and C are 10 nA, 34 nA, and 19 nA, respectively. Therefore, it can be seen that the pattern form of the zinc oxide nanostructures can be selectively adjusted on a non-planar substrate through the liquid masking layer, and characteristics of a device fabricated using such zinc oxide nanostructures can also be easily controlled.

Although the present invention has been described with reference to some embodiments, it should be understood that the foregoing embodiments are provided for illustration only and are not to be construed in any way as limiting the present invention, and that various modifications, changes, alterations, and equivalent embodiments can be made by those skilled in the art without departing from the spirit and scope of the invention.

What is claimed is:

1. A method of preparing zinc oxide nanostructures using a liquid masking layer, comprising:
    preparing a substrate having a zinc oxide seed layer formed thereon;
    loading the substrate in a reactor in which a lower liquid masking layer, a precursor liquid layer for hydrothermal growth, and an upper liquid masking layer are disposed in order; and
    forming zinc oxide nanostructures in a pattern on the substrate through hydrothermal growth by heating the precursor liquid layer for hydrothermal growth.

2. The method according to claim 1, wherein the lower liquid masking layer and the upper liquid masking layer comprise materials not mixable with the precursor liquid layer for hydrothermal growth.

3. The method according to claim 1, wherein the lower liquid masking layer comprises a material having a higher density than the precursor liquid layer for hydrothermal growth, and the upper liquid masking layer comprises a material having a lower density than the precursor liquid layer for hydrothermal growth.

4. The method according to claim 1, wherein the precursor liquid layer for hydrothermal growth comprises a zinc precursor liquid and an ammonia solution.

5. The method according to claim 4, wherein the zinc precursor liquid comprises at least one selected from among zinc acetate ($Zn(CH_3CO_2)_2$), zinc nitrate ($Zn(NO_3)_2$), zinc sulfate ($ZnSO_4$), zinc chloride ($ZnCl_2$), and derivatives thereof.

6. The method according to claim 1, wherein the precursor liquid layer for hydrothermal growth further comprises an additive for controlling a shape of the zinc oxide nanostructures.

7. The method according to claim 6, wherein the additive comprises at least one selected from among polyethylene imine, ethylenediamine, and sodium citrate.

8. The method according to claim 1, wherein the upper liquid masking layer maintains a pH value within the reactor.

9. The method according to claim 1, wherein, in formation of the zinc oxide nanostructures in a pattern on the substrate through hydrothermal growth, the precursor liquid layer is heated to a temperature of 70° C. to 200° C.

10. The method according to claim 1, wherein a pattern pitch of the zinc oxide nanostructures formed on the substrate is controlled by adjusting a height of the precursor liquid layer for hydrothermal growth to change a contact area between the substrate and the precursor liquid layer for hydrothermal growth.

11. The method according to claim 1, wherein a pattern form of the zinc oxide nanostructures is controlled by regulating a moving mode and a moving speed of the substrate within the reactor.

* * * * *